(12) United States Patent
Ishii

(10) Patent No.: US 12,310,128 B2
(45) Date of Patent: May 20, 2025

(54) PHOTODETECTOR, SOLID-STATE IMAGING DEVICE, AND DISTANCE MEASURING DEVICE

(71) Applicant: Panasonic Intellectual Property Management Co., Ltd., Osaka (JP)

(72) Inventor: Motonori Ishii, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 471 days.

(21) Appl. No.: 17/752,408

(22) Filed: May 24, 2022

(65) Prior Publication Data

US 2022/0285420 A1    Sep. 8, 2022

Related U.S. Application Data

(63) Continuation of application No. PCT/JP2020/041462, filed on Nov. 6, 2020.

(30) Foreign Application Priority Data

Nov. 29, 2019    (JP) .................................. 2019-217324

(51) Int. Cl.
*H10F 39/18* (2025.01)
*H04N 25/62* (2023.01)
*H10F 39/00* (2025.01)

(52) U.S. Cl.
CPC ............ *H10F 39/18* (2025.01); *H04N 25/62* (2023.01); *H10F 39/8027* (2025.01); *H10F 39/8037* (2025.01)

(58) Field of Classification Search
CPC .. H10F 39/18; H10F 39/8027; H10F 39/8037; H10F 30/20; H10F 30/225; H04N 25/62; H04N 25/76; H04N 25/77; G01S 7/486
See application file for complete search history.

(56) References Cited

U.S. PATENT DOCUMENTS

| | | | |
|---|---|---|---|
| 10,715,756 B1* | 7/2020 | Tsai ....................... | H04N 25/75 |
| 11,108,980 B2* | 8/2021 | Palubiak ................ | H10F 77/959 |
| 2008/0231339 A1* | 9/2008 | Deschamps .......... | H04N 25/773 |
| | | | 327/326 |

(Continued)

FOREIGN PATENT DOCUMENTS

| | | |
|---|---|---|
| JP | 2018-174224 A | 11/2018 |
| JP | 2019-075394 A | 5/2019 |
| WO | 2018/216400 A1 | 11/2018 |

OTHER PUBLICATIONS

International Search Report issued on Jan. 19, 2021 in International Patent Application No. PCT/JP2020/041462, with English translation.

*Primary Examiner* — Albert H Cutler
(74) *Attorney, Agent, or Firm* — Rimon P.C.

(57) ABSTRACT

A photodetector includes a plurality of pixels and a common reset line connected to the pixels, and each of the pixels includes: an avalanche photodiode; a quenching transistor that includes a gate and a source which are connected to the cathode of the avalanche photodiode; and a photodiode reset transistor that includes a source and a drain one of which is connected to the drain of the quenching transistor and the other of which is connected to the common reset line.

10 Claims, 10 Drawing Sheets

(56) References Cited

U.S. PATENT DOCUMENTS

2017/0301816 A1* 10/2017 Moore .................. H10F 30/225
2020/0106982 A1   4/2020 Kasuga et al.
2020/0314375 A1  10/2020 Nishino et al.

* cited by examiner

PHOTODETECTOR, SOLID-STATE IMAGING DEVICE, AND DISTANCE MEASURING DEVICE

CROSS REFERENCE TO RELATED APPLICATIONS

This is a continuation application of PCT International Application No. PCT/JP2020/041462 filed on Nov. 6, 2020, designating the United States of America, which is based on and claims priority of Japanese Patent Application No, 2019-217324 filed on Nov. 29, 2019. The entire disclosures of the above-identified applications, including the specifications, drawings and claims are incorporated herein by reference in theft entirety.

FIELD

The present disclosure relates to photodetectors, solid-state imaging devices, and distance measuring devices.

BACKGROUND

Conventionally, a photodetector which uses an avalanche photodiode is known (see, for example, PTL1).

CITATION LIST

Patent Literature

PTL 1: International Publication No. 2018/216400

SUMMARY

Technical Problem

The present disclosure provides a photodetector and the like which can accurately reset the potential of the cathode of an avalanche photodiode.

Solution to Problem

A photodetector according to an aspect of the present disclosure includes: a plurality of pixels; and a common reset line that is connected to the plurality of pixels, and each of the plurality of pixels includes: an avalanche photodiode; a quenching transistor that includes a gate and a source which are connected to a cathode of the avalanche photodiode; and a photodiode reset transistor that includes a source and a drain one of which is connected to a drain of the quenching transistor and the other of which is connected to the common reset line.

A solid-state imaging device according to an aspect of the present disclosure includes the photodetector described above, and further includes: a pixel array that includes the plurality of pixels which are arranged in a matrix; a column circuit that reads signals from the plurality of pixels row by row; a vertical transfer circuit that selects a row from which the column circuit reads signals; an all-pixel drive driver that drives a signal line common to all the plurality of pixels; a horizontal transfer circuit that transfers the signals read by the column circuit; and an output amplifier that outputs, to an outside, the signals transferred by the horizontal transfer circuit.

A distance measuring device according to an aspect of the present disclosure includes: a light source that emits light to a subject: the solid-state imaging device described above that receives reflected light resulting from the light emitted from the light source being reflected off the subject; and a signal processing device that calculates a distance to the subject based on signals output from the solid-state imaging device.

Advantageous Effects

According to the present disclosure, it is possible to accurately reset the potential of the cathode of an avalanche photodiode.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Background to Conception of Aspect of Present Disclosure

Although photodetectors have conventionally focused on imaging images with high sensitivity and high definition, a photodetector which also has the function of acquiring information on a distance from the photodetector have appeared in recent years. When the distance information is added to an image, it is possible to sense three-dimensional information on a target to be imaged by the photodetector. For example, when the photodetector images a person, the photodetector can three-dimensionally detect a move (gesture), with the result that the photodetector can be used as an input device for various devices. In a further example, when an automobile is equipped with the photodetector, it is possible to recognize a distance to an object, a person, or the like present around the automobile, with the result that the photodetector can be applied to collision prevention, automated driving, and the like.

Among various methods used for measuring a distance from a photodetector to an object, there is a time of flight (TOF) method for measuring a time which has elapsed since the application of light from near a photodetector toward an object until the light is returned to the photodetector after being reflected off the object. By this method, it is possible to measure, with high resolution, a distance to a distant object by increasing the intensity of a light source.

In order to measure a distance to a distant object, it is necessary to provide a photodetector whose sensitivity is high enough to detect weak light reflected off the object. It is also necessary to be able to detect timing at which the reflected light reaches the photodetector. In order to satisfy these two requirements, for example, a photodetector can be considered which has the following configuration and includes an avalanche photodiode.

Figure 10:
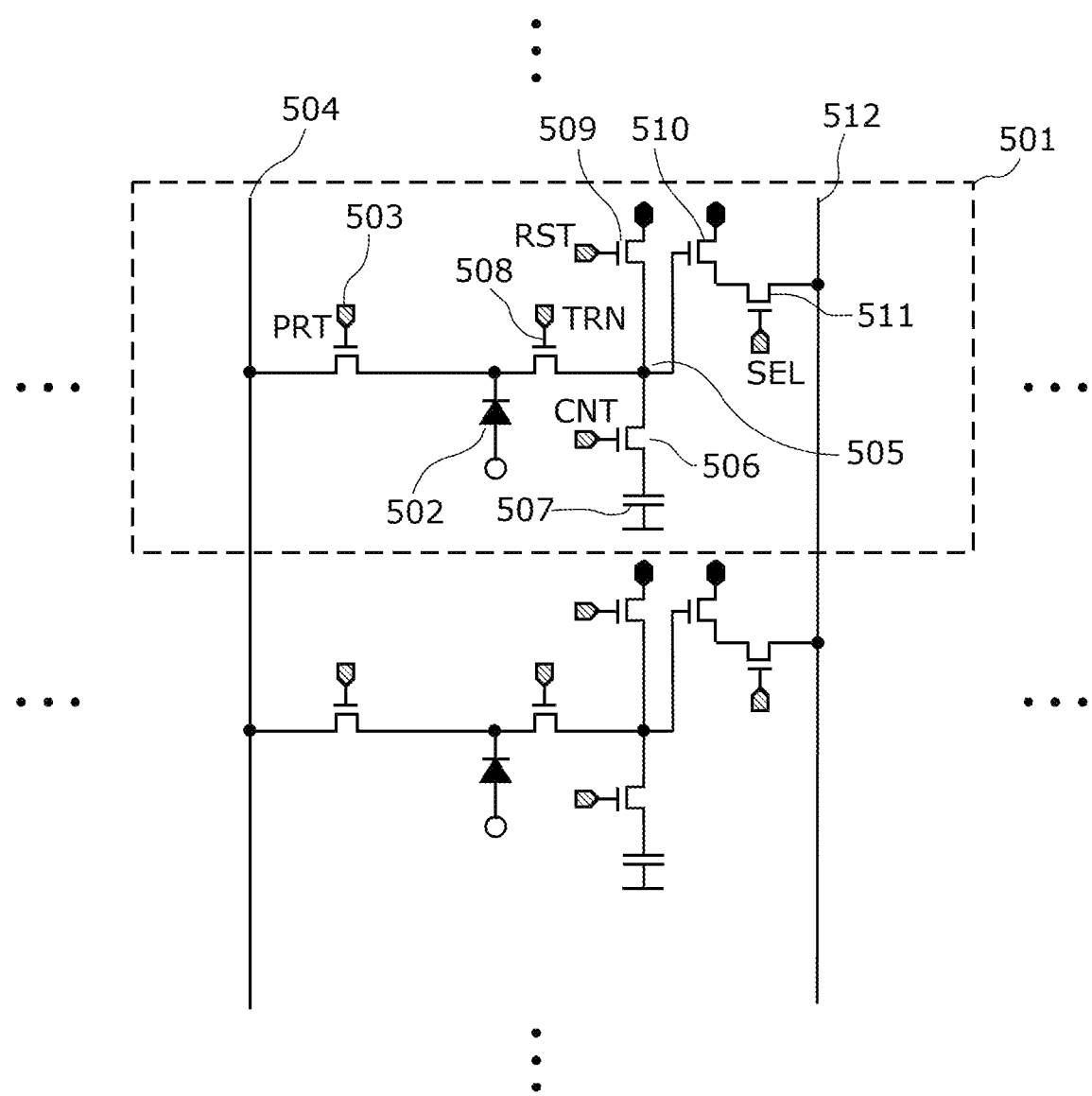
FIG. 10 is a circuit diagram showing the configuration of pixels included in a photodetector according to a comparative example.

FIG. 10 is a circuit diagram showing the configuration of pixels 501 included in a photodetector according to a comparative example.

As shown in FIG. 10, the photodetector according to the comparative example includes, in addition to a plurality of pixels 501, common reset line 504 which is connected to pixels 501 and read line 512 which is connected to pixels 501.

Common reset line 504 is a signal line for providing a reset potential to the cathodes of avalanche photodiodes 502 (described later) included in pixels 501 to which common reset line 504 is connected, and is connected to a power supply for supplying the reset potential.

Read line 512 is a signal line for reading, out of pixels 501, signals corresponding to charge stored in charge storages 505 (described later) included in pixels 501 to which read line 512 is connected.

Pixel 501 includes avalanche photodiode 502, photodiode reset transistor 503, charge storage 505, transfer gate transistor 508, reset transistor 509, amplifying transistor 510, and selection transistor 511.

Avalanche photodiode 502 is a photodiode in which a phenomenon called avalanche multiplication is utilized to increase light receiving sensitivity. Even when avalanche photodiode 502 receives weak light, generated electrons are subjected to avalanche multiplication, and thus a large voltage amplitude is produced at a cathode.

Photodiode reset transistor 503 is a transistor for causing the cathode of avalanche photodiode 502 to have the reset potential, one of a source and a drain is connected to the cathode of avalanche photodiode 502, and the other of the source and the drain is connected to common reset line 504. Photodiode reset transistor 503 is turned on, and thus the cathode of avalanche photodiode 502 can be caused to have the reset potential.

Charge storage 505 stores charge generated by avalanche photodiode 502. In charge storage 505, a capacitance of the order of femtofarads is superimposed.

Transfer gate transistor 508 is a transistor for transferring the charge generated by avalanche photodiode 502 to charge storage 505, one of a source and a drain is connected to the cathode of avalanche photodiode 502, and the other of the source and the drain is connected to charge storage 505, Transfer gate transistor 508 is turned on, and thus the charge generated by avalanche photodiode 502 can be transferred to charge storage 505.

Reset transistor 509 is a transistor for causing charge storage 505 to have the reset potential, and one of a source and a drain is connected to charge storage 505. For example, the other of the source and the drain may be connected to common reset line 504 or may be connected to a signal line which is connected to another power supply for supplying the reset potential. Reset transistor 509 is turned on, and thus charge storage 505 can be caused to have the reset potential.

Amplifying transistor 510 is a transistor for outputting, to selection transistor 511, a signal corresponding to the potential of charge storage 505, and a gate is connected to charge storage 505.

Selection transistor 511 is a transistor for outputting, to read line 512, the signal output by amplifying transistor 510, one of a source and a drain is connected to one of the source and the drain of the amplifying transistor, and the other of the source and the drain is connected to read line 512. Selection transistor 511 is turned on, and thus the signal output by amplifying transistor 510 can be output to read line 512.

The present inventor has found the following problem in the photodetector of the configuration described above according to the comparative example.

When the photodetector of the configuration described above according to the comparative example is applied to a distance measuring device which utilizes the TOF method to measure a distance to a subject, it is necessary to simultaneously turn on, immediately before the timing of exposure, photodiode reset transistors 503 in all pixels 501 so as to cause the cathodes of avalanche photodiodes 502 in all pixels 501 to have the reset potential. When in a period during which the cathodes of avalanche photodiodes 502 in all pixels 501 are caused to have the reset potential, that is, in a period during which photodiode reset transistors 503 in all pixels 501 are kept on, avalanche multiplication occurs in avalanche photodiode 502 of certain pixel 501, the multiplied charge reaches, via common reset line 504, the cathodes of avalanche photodiodes 502 in adjacent pixels 501. Hence, a failure occurs in which the cathodes of avalanche photodiodes 502 in adjacent pixels 501 cannot be caused to properly have the reset potential. In the following description, a phenomenon in which the failure described above occurs is referred to as a "problem of charge flowing into adjacent pixels".

Hence, the present inventor has conducted a thorough study, experiments, and the like so that even when in a period during which the cathodes of avalanche photodiodes 502 in a plurality of pixels 501 are caused to have the reset potential, avalanche multiplication occurs in avalanche photodiode 502 of certain pixel 501, the cathodes of avalanche photodiodes 502 in other pixels 501 are caused to properly have the reset potential. Then, the present inventor has conceived a photodetector according to an aspect of the present disclosure and the like which will be described below.

A photodetector according to an aspect of the present disclosure includes: a plurality of pixels; and a common reset line that is connected to the plurality of pixels, and each of the plurality of pixels includes: an avalanche photodiode; a quenching transistor that includes a gate and a source which are connected to a cathode of the avalanche photodiode; and a photodiode reset transistor that includes a source and a drain one of which is connected to a drain of the quenching transistor and the other of which is connected to the common reset line.

In the photodetector configured as described above, even when in a period during which the photodiode reset transistors in the plurality of pixels are kept on, avalanche multiplication occurs in the avalanche photodiode of a certain pixel, the quenching transistor suppresses the flow of the multiplied charge into the common reset line. Hence, in the photodetector configured as described above, the potential of the cathode of the avalanche photodiode can be accurately reset.

Each of the plurality of pixels may further include: a charge storage that stores charge generated by the avalanche photodiode; and a transfer gate transistor that includes a source and a drain one of which is connected to the cathode of the avalanche photodiode and the other of which is connected to the charge storage.

In this way, it is possible to store, in the charge storage, the charge generated by the avalanche photodiode.

The photodetector may further include a read line that is connected to the plurality of pixels, and each of the plurality of pixels may further include: a reset transistor that includes a source and a drain one of which is connected to the charge storage; an amplifying transistor that includes a gate which is connected to the charge storage; and a selection transistor that includes a source and a drain one of which is connected to one of a source and a drain of the amplifying transistor and the other of which is connected to the read line.

In this way, a signal corresponding to the charge stored in charge storage can be read out of the pixel.

Each of the plurality of pixels may further include, between the cathode of the avalanche photodiode and the gate and the source of the quenching transistor: a charge storage that is connected to the gate and the source of the quenching transistor and stores charge generated by the avalanche photodiode; and a transfer gate transistor that includes a source and a drain one of which is connected to the cathode of the avalanche photodiode and the other of which is connected to the charge storage, and the cathode of the avalanche photodiode is connected to the gate and the source of the quenching transistor via the charge storage and the transfer gate transistor.

In this way, the charge generated by the avalanche photodiode can be stored in the charge storage.

The photodetector may further include a read line that is connected to the plurality of pixels, and each of the plurality of pixels may further include: an amplifying transistor that includes a gate which is connected to the charge storage; and a selection transistor that includes a source and a drain one of which is connected to one of a source and a drain of the amplifying transistor and the other of which is connected to the read line.

In this way, the signal corresponding to the charge stored in charge storage can be read out of the pixel.

Each of the plurality of pixels may further include: a count transistor that includes a source and a drain one of which is connected to the charge storage; and a count capacitor that is connected to the other of the source and the drain of the count transistor.

In this way, the charge stored in the charge storage can be transferred to the count capacitor.

When a potential of the cathode of the avalanche photodiode is a potential at which avalanche multiplication stops, the quenching transistor may be in a weak inversion state.

In this way, the amount of charge flowing between the avalanche photodiode and the common reset line can be greater than or equal to the amount of charge flowing through the quenching transistor in the weak inversion state.

When the photodiode reset transistor is on, a time constant of an electrical path from the cathode of the avalanche photodiode to the common reset line may be greater than or equal to 100 ps.

In this way, the amount of charge flowing between the avalanche photodiode and the common reset line can be less than or equal to the amount of charge determined by the time constant which is greater than or equal to 100 ps.

A solid-state imaging device according to an aspect of the present disclosure includes the photodetector described above, and further includes: a pixel array that includes the plurality of pixels which are arranged in a matrix; a column circuit that reads signals from the plurality of pixels row by row; a vertical transfer circuit that selects a row from which the column circuit reads signals; an all-pixel drive driver that drives a signal line common to all the plurality of pixels; a horizontal transfer circuit that transfers the signals read by the column circuit; and an output amplifier that outputs, to an outside, the signals transferred by the horizontal transfer circuit.

In the solid-state imaging device configured as described above, even when in a period during which the photodiode reset transistors in the plurality of pixels are kept on, avalanche multiplication occurs in the avalanche photodiode of a certain pixel, the quenching transistor suppresses the flow of the multiplied charge into the common reset line. Hence, in the solid-state imaging device configured as described above, the potential of the cathode of the avalanche photodiode can be accurately reset.

A distance measuring device according to an aspect of the present disclosure includes: a light source that emits light to a subject: the solid-state imaging device described above that receives reflected light resulting from the light emitted from the light source being reflected off the subject; and a signal processing device that calculates a distance to the subject based on signals output from the solid-state imaging device.

In the distance measuring device configured as described above, even when in a period during which the photodiode reset transistors in the plurality of pixels are kept on, avalanche multiplication occurs in the avalanche photodiode of a certain pixel, the quenching transistor suppresses the flow of the multiplied charge into the common reset line. Hence, in the distance measuring device configured as described above, the potential of the cathode of the avalanche photodiode can be accurately reset.

Specific examples of the photodetector according to the aspect of the present disclosure and the like will be described below with reference to drawings. The embodiments described below show comprehensive or specific examples. Values, shapes, materials, constituent elements, the arrangement positions and connection form of the constituent elements, and the like which are shown in the embodiments below are examples and are not intended to limit the present disclosure.

The drawings are schematic views and are not exactly shown. In the drawings, substantially the same configurations are identified with the same reference signs, and repeated description thereof may be omitted or simplified.

Embodiment 1

Figure 1:
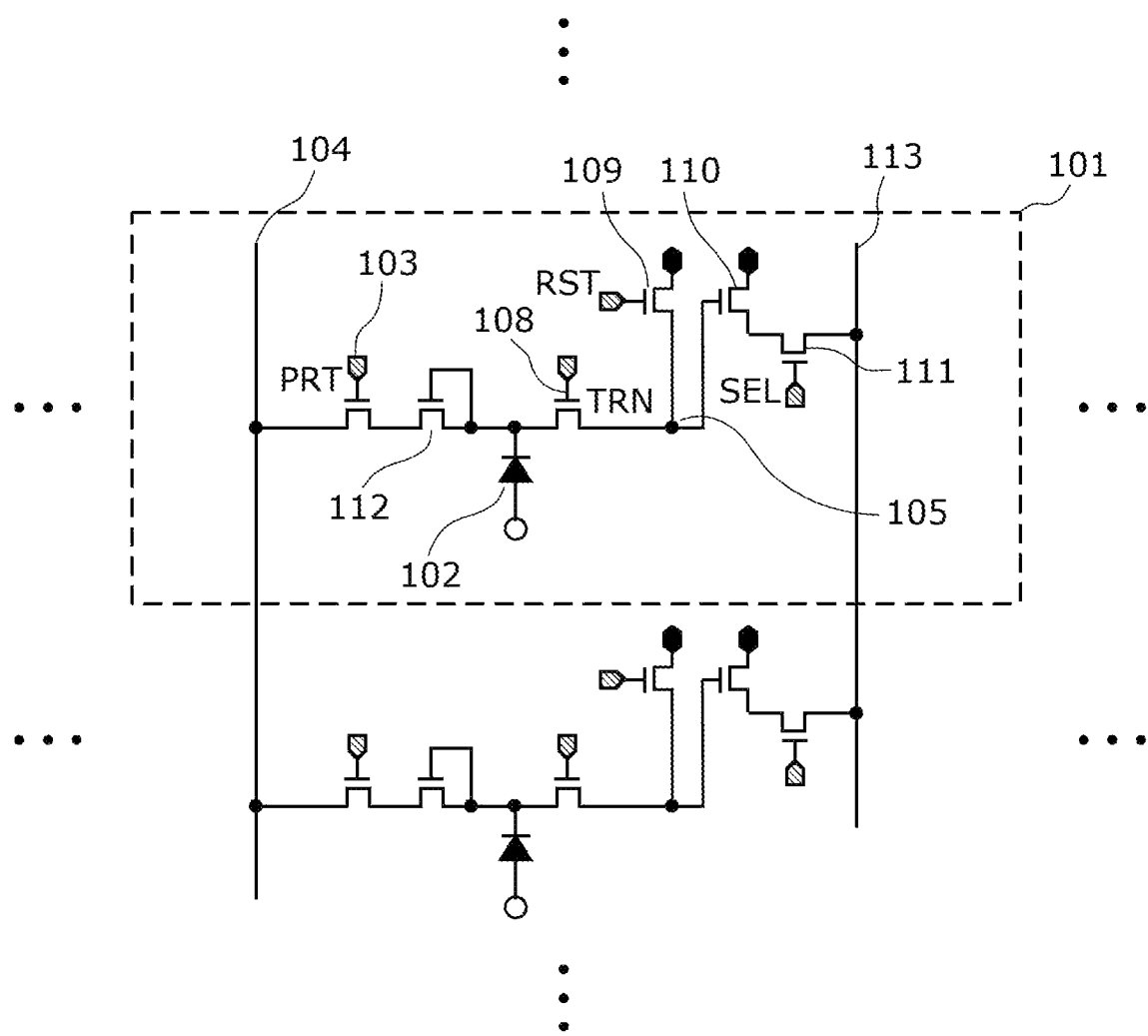
FIG. 1 is a circuit diagram showing the configuration of pixels included in a photodetector according to Embodiment 1.

FIG. 1 is a circuit diagram showing the configuration of a photodetector according to Embodiment 1.

As shown in FIG. 1, the photodetector according to the embodiment includes, in addition to a plurality of pixels 101, common reset line 104 which is connected to pixels 101 and read line 113 which is connected to pixels 101.

Common reset line 104 is a signal line for providing a reset potential to the cathodes of avalanche photodiodes 102 (described later) included in pixels 101 to which common reset line 104 is connected, and is connected to a power supply for supplying the reset potential.

Read line 113 is a signal line for reading, out of pixels 101, signals corresponding to charge stored in charge storages 105 (described later) included in pixels 101 to which read line 113 is connected.

Pixel 101 includes avalanche photodiode 102, photodiode reset transistor 103, charge storage 105, transfer gate transistor 108, reset transistor 109, amplifying transistor 110, selection transistor 111, and quenching transistor 112.

Pixels 101 are arranged, for example, in a matrix.

Avalanche photodiode 102 is a photodiode in which a phenomenon called avalanche multiplication is utilized to increase light receiving sensitivity. Even when avalanche photodiode 102 receives weak light, generated electrons are subjected to avalanche multiplication, and thus a large voltage amplitude is produced at a cathode.

Photodiode reset transistor 103 is a transistor for causing the cathode of avalanche photodiode 102 to have the reset potential via quenching transistor 112, one of a source and a drain is connected to the drain of the quenching transistor, and the other of the source and the drain is connected to common reset line 104. Photodiode reset transistor 103 is turned on, and thus the cathode of avalanche photodiode 102 can be caused to have the reset potential via quenching transistor 112.

Charge storage 105 stores charge generated by avalanche photodiode 102. In charge storage 105, a capacitance of the order of femtofarads is superimposed.

Transfer gate transistor 108 is a transistor for transferring the charge generated by avalanche photodiode 102 to charge storage 105, one of a source and a drain is connected to the cathode of avalanche photodiode 102, and the other of the source and the drain is connected to charge storage 105, Transfer gate transistor 108 is turned on, and thus the charge generated by avalanche photodiode 102 can be transferred to charge storage 105.

Reset transistor 109 is a transistor for causing charge storage 105 to have the reset potential, and one of a source and a drain is connected to charge storage 105, For example, the other of the source and the drain may be connected to common reset line 104 or may be connected to a signal line which is connected to another power supply for supplying the reset potential. Reset transistor 109 is turned on, and thus charge storage 105 can be caused to have the reset potential.

Amplifying transistor 110 is a transistor for outputting, to selection transistor 111, a signal corresponding to the potential of charge storage 105, and a gate is connected to charge storage 105.

Selection transistor 111 is a transistor for outputting, to read line 113, the signal output by amplifying transistor 110, one of a source and a drain is connected to one of the source and the drain of the amplifying transistor, and the other of the source and the drain is connected to read line 113. Selection transistor 111 is turned on, and thus the signal output by amplifying transistor 110 can be output to read line 113.

Pixel 101 included in the photodetector according to Embodiment 1 essentially differs from pixel 501 included in the photodetector according to the comparative example in that pixel 101 includes quenching transistor 112.

The gate and the source of quenching transistor 112 are connected to the cathode of avalanche photodiode 102.

Since in the cathode of avalanche photodiode 102, not holes but electrons are generated, the potential of the cathode of avalanche photodiode 102 is prevented from being higher than the potential of common reset line 104. Hence, a source-to-drain current in quenching transistor 112 is substantially determined by the threshold voltage of quenching transistor 112.

In the photodetector according to Embodiment 1, pixel 101 includes quenching transistor 112, and thus the problem of charge flowing into adjacent pixels described above can be solved. The reason for it will be described below.

The time at which avalanche multiplication starts in avalanche photodiode 102 when photodiode reset transistor 103 is on is considered.

Although the duration of an avalanche multiplication process differs depending on the size of avalanche photodiode 102, the avalanche multiplication process generally continues for a time of the order of 100 ps.

When sufficient current does not flow through quenching transistor 112, charge generated by the avalanche multiplication is stored in a P-N junction inside avalanche photodiode 102. Then, the charge applied to the P-N junction is attenuated by the stored charge, and then when the magnitude of a magnetic field drops below a threshold value for causing the avalanche multiplication, the avalanche multiplication process is stopped.

By contrast, when sufficient current flows through quenching transistor 112, electrons generated by the avalanche multiplication flow to common reset line 104 through photodiode reset transistor 103 and quenching transistor 112. Hence, electrons are prevented from being stored in the n side of the P-N junction inside avalanche photodiode 102, and thus the charge applied to the P-N junction is not attenuated. Therefore, the stop of the avalanche multiplication process is prevented, and thus during the period of the avalanche multiplication process, the flow of electrons from the cathode of avalanche photodiode 102 to common reset line 104 is continued. The outflow rate thereof exceeds the capacity of common reset line 104 to discharge charge, and thus the potential of common reset line 104 is lowered. In other pixels 101 connected to common reset line 104, electrons flow from common reset line 104 into the cathodes of avalanche photodiodes 102 in pixels 101. Thereafter, although photodiode reset transistor 103 is turned off to complete a reset period, in pixels 101 described above, the potentials of the cathodes of avalanche photodiodes 102 are not properly reset by the inflow of the electrons.

In pixel 101 configured as described above, quenching transistor 112 is set such that, when the potential of the cathode of avalanche photodiode 102 is a potential which stops the avalanche multiplication, quenching transistor 112 is in a weak inversion state. Then, when photodiode reset transistor 103 is on, even if the avalanche multiplication starts in avalanche photodiode 102, it takes much time for charge generated by the avalanche multiplication to flow to common reset line 104 via photodiode reset transistor 103 and quenching transistor 112. As described above, since the multiplication process of avalanche photodiode 102 is completed for a time of the order of 100 ps, the flow of charge to common reset line 104 hardly occurs during this period. In other words, it is possible to prevent the occurrence of the problem of charge flowing into adjacent pixels.

More specifically, quenching transistor 112 is set such that almost no current flows for 100 ps during which the avalanche multiplication process in avalanche photodiode 102 occurs. In other words, quenching transistor 112 may be set such that, when photodiode reset transistor 103 is on, the time constant of an electrical path from the cathode of avalanche photodiode 102 to common reset line 104 is greater than or equal to 100 ps. For example, when the capacitance of avalanche photodiode 102 is assumed to be 10 fF, a charge of 10 fC is needed so that the potential of the cathode of avalanche photodiode 102 is changed by 1V. In order to supply this charge for 100 ps, it is necessary to provide a current of 100 μA. Hence, quenching transistor 112 may be set such that a current which flows when a gate-to-source voltage in quenching transistor 112 is 0V is less than or equal to 100 μA.

On the other hand, when a current flowing through quenching transistor 112 is excessively low, the potential of the cathode of avalanche photodiode 102 is not properly reset. In order to cause the potential to be properly reset, it is necessary to increase the reset period for performing a reset step beyond the period of the avalanche multiplication process in avalanche photodiode 102. Then, quenching transistor 112 may be set such that during the reset period, the potential of the cathode of avalanche photodiode 102 can be properly reset. For example, it is assumed that the reset period is 1 μs, the amplitude in avalanche photodiode 102 at the time of avalanche multiplication is 1V, and the capacitance of avalanche photodiode 102 is 10 fF. Here, quenching transistor 112 may be set such that the current which flows when the gate-to-source voltage in quenching transistor 112 is 0V is greater than or equal to 0.1 μA.

An operation performed by the photodetector according to Embodiment 1 will be described below.

Figure 2:
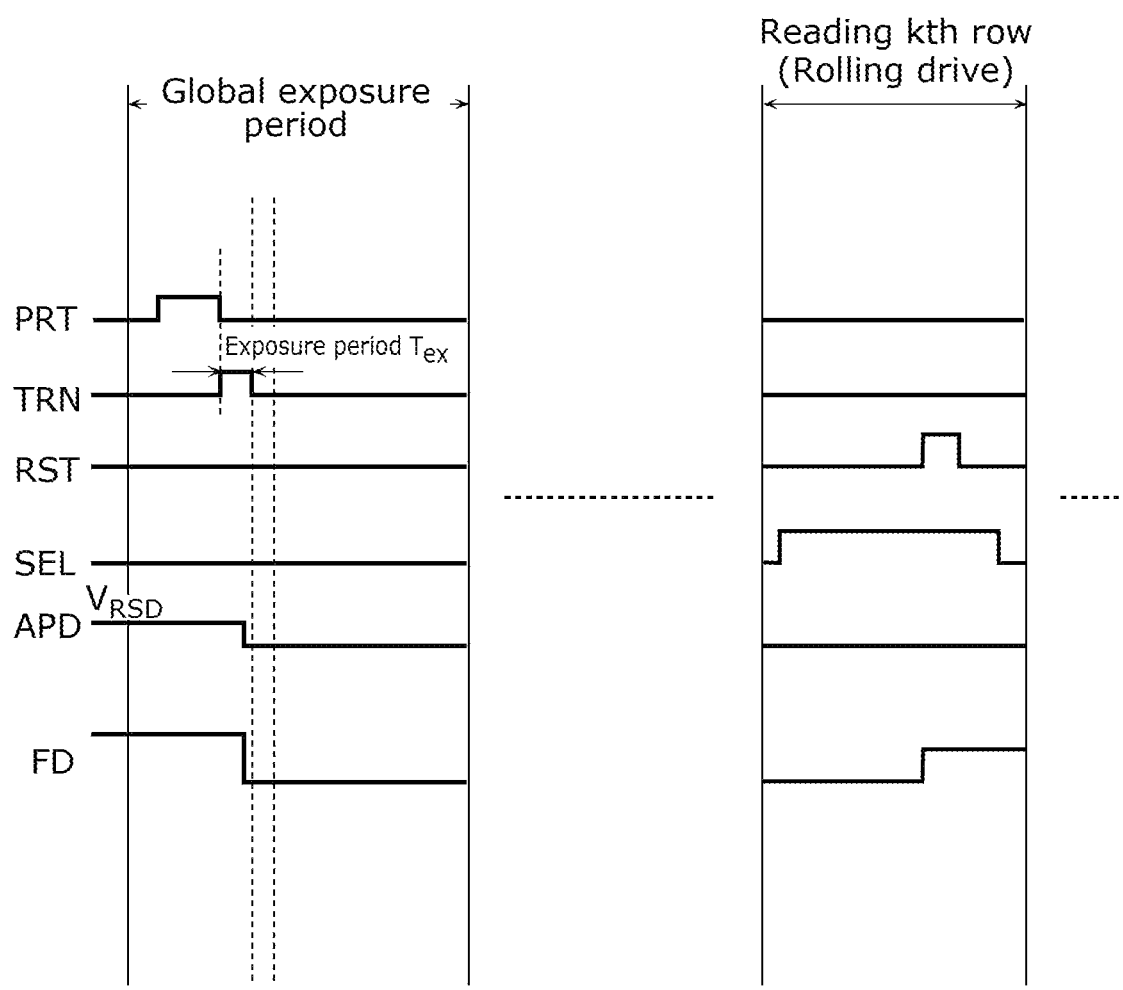
FIG. 2 is a sequence diagram showing an example of an operation performed by the photodetector according to Embodiment 1.

FIG. 2 is a sequence diagram showing an example of the operation performed by the photodetector according to Embodiment 1.

As shown in FIG. 2, in a global exposure period, the photodetector according to Embodiment 1 simultaneously drives high signal line PRT for all pixels 101 which is connected to the gates of photodiode reset transistors 103 so as to start an operation of resetting the potentials of the cathodes of avalanche photodiodes 102 in all pixels 101. Here, even when avalanche multiplication occurs in avalanche photodiode 102 of certain pixel 101, the flow of electrons generated by the avalanche multiplication to common reset line 104 is restricted by quenching transistor 112 in pixel 101 described above. Hence, the flow of electrons into the cathodes of avalanche photodiodes 102 in adjacent pixels 101 is prevented, Thereafter, the photodetector according to Embodiment 1 simultaneously drives signal line PRT for all pixels low to stop the reset operation.

Thereafter, the photodetector according to Embodiment 1 simultaneously drives high signal line TRN for all pixels 101 which is connected to the gates of transfer gate transistors 108 so as to turn on transfer gate transistors 108 in all pixels 101, Immediately after this operation, the multiplied charge generated in avalanche photodiodes 102 is transferred to charge storages 105. Thereafter, the photodetector according to Embodiment 1 simultaneously drives signal line TRN for all pixels low. The period during which signal line TRN is high is caused to coincide with a period during which exposure is performed, and thus a desired exposure operation performed by the photodetector according to Embodiment 1 is realized.

After the global exposure period, the photodetector according to Embodiment 1 performs a sequential row feed operation (rolling drive operation) to read a signal corresponding to charge stored in charge storage 105 of each pixel 101. FIG. 2 illustrates an operation of reading the kth row.

In an operation of reading each row, the photodetector according to Embodiment 1 simultaneously drives high signal line SEL only for pixels 101 in the target row which is connected to the gates of selection transistors 111 so as to turn on selection transistors 111 in pixels 101 in the row. Then, signals (which are referred to as "first signals" for convenience) corresponding to charge stored in charge storages 105 are output from amplifying transistors 110 to read line 113.

Thereafter, the photodetector according to Embodiment 1 simultaneously drives high signal line RST only for pixels 101 in the target row which is connected to the gates of reset transistors 109 so as to turn on reset transistors 109 in pixels 101 in the row. Then, the charge stored in charge storages 105 is discharged. Then, signals (which are also referred to as "second signals" for convenience) corresponding to the potentials of charge storages 105 in a state where the charge is discharged are output from amplifying transistors 110 to read line 113.

Thereafter, the photodetector according to Embodiment 1 simultaneously drives low signal line RST only for pixels 101 in the row, and simultaneously drives low signal line SEL only for pixels 101 in the row. Here, the operation of reading each row is completed.

Thereafter, the photodetector according to Embodiment 1 or an external device performs correlated double sampling (CDS) processing on the first and second signals which are output, and thus information as to whether avalanche photodiodes 102 perform avalanche multiplication during the exposure period is obtained.

Embodiment 2

Figure 3:
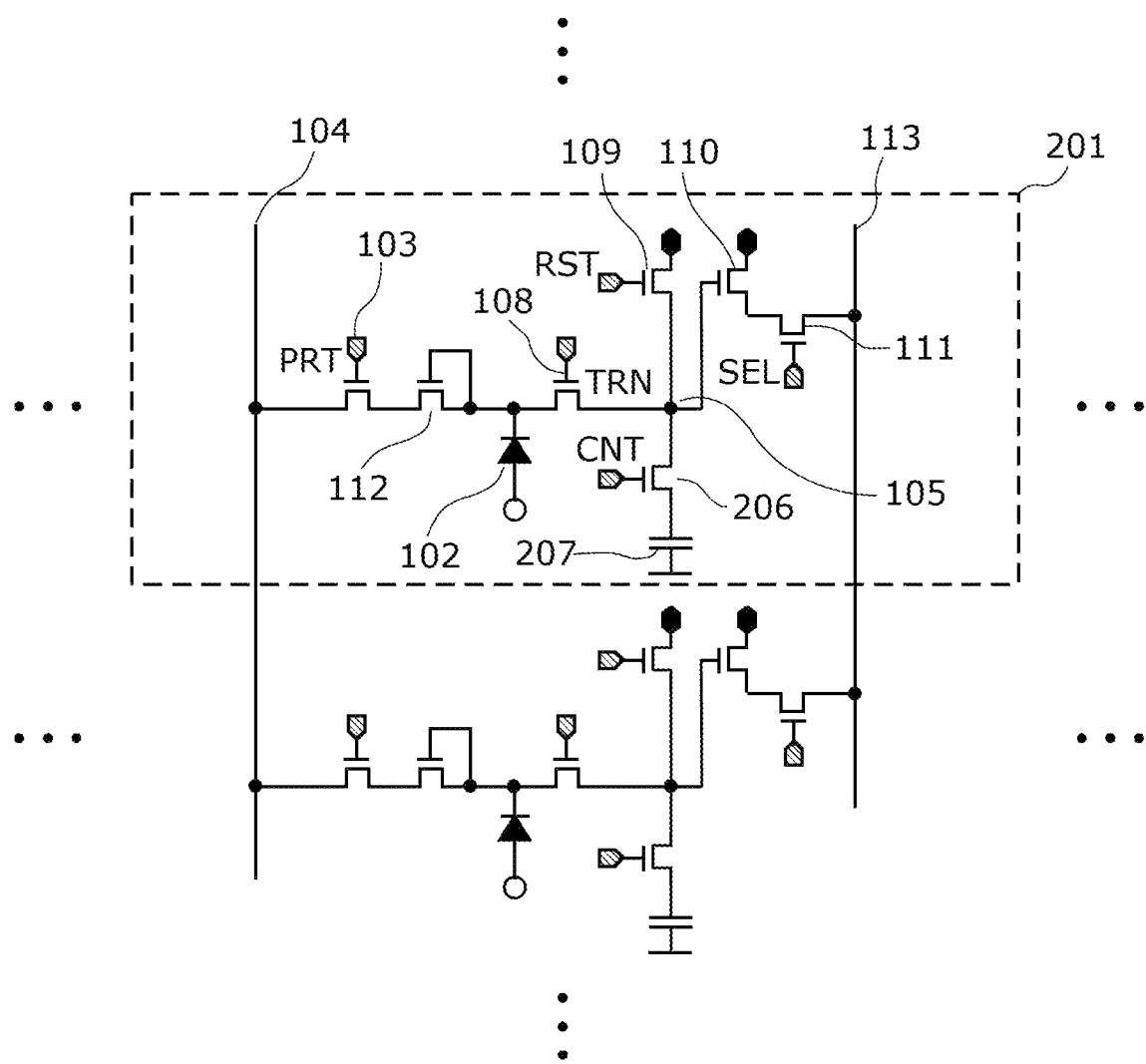
FIG. 3 is a circuit diagram showing the configuration of pixels included in a photodetector according to Embodiment 2.

FIG. 3 is a circuit diagram showing the configuration of a photodetector according to Embodiment 2. In the following description, constituent elements of the photodetector according to Embodiment 2 similar to the constituent elements of the photodetector according to Embodiment 1 are considered to have already been described and are therefore identified with the same reference signs, thus a detailed description thereof is omitted, and a description will be given mainly on differences from the photodetector according to Embodiment 1.

As shown in FIG. 3, the photodetector according to Embodiment 2 differs from the photodetector according to Embodiment 1 in that pixels 101 are changed to pixels 201.

In pixels 201, count transistors 206 and count capacitors 207 are added to pixels 101.

Count transistor 206 is a transistor for transferring the charge stored in charge storage 105 to count capacitor 207, and one of a source and a drain is connected to charge storage 105, Count transistor 206 is turned on, and thus the charge stored in charge storage 105 can be transferred to count capacitor 207.

Count capacitor 207 is connected to the other of the source and the drain of count transistor 206, and stores the charge transferred from charge storage 105. The potential of count capacitor 207 is a potential which corresponds to the number of times the charge is transferred from charge storage 105.

In the photodetector of the configuration described above according to Embodiment 2, for the same reason as in the photodetector according to Embodiment 1, the problem of charge flowing into adjacent pixels can be solved.

An operation performed by the photodetector according to Embodiment 2 will be described below.

Figure 4:
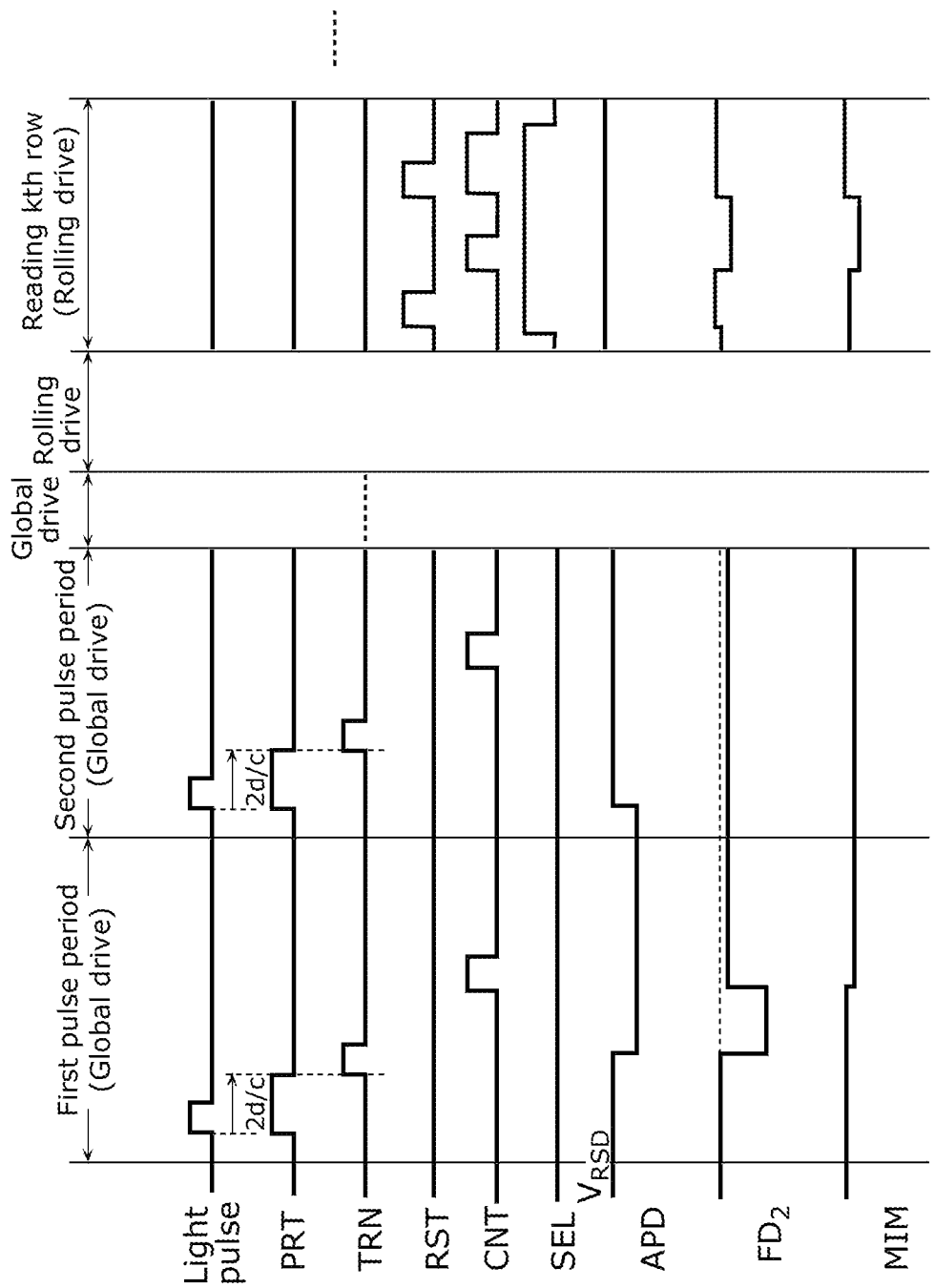
FIG. 4 is a sequence diagram showing an example of an operation performed by the photodetector according to Embodiment 2.

FIG. 4 is a sequence diagram showing an example of the operation performed by the photodetector according to Embodiment 2. The operation illustrated here is an example of an operation for detecting a distance to a subject by utilizing the TOF method. Here, a description will be given on the assumption that the photodetector according to Embodiment 2 includes a light source for emitting light (light pulses) applied to the subject, and that a plurality of pixels 201 receive reflected light resulting from the light emitted from the light source being reflected off the subject.

As shown in FIG. 4, in a first pulse period, the photodetector according to Embodiment 2 emits light pulses from the light source and simultaneously drives signal line PRT for all pixels 201 high to start an operation of resetting the potentials of the cathodes of avalanche photodiodes 102 in all pixels 201.

Then, at timing corresponding to the beginning of a distance zone to be measured (after 2d/c where its distance is d and the speed of light is c), the photodetector according to Embodiment 2 simultaneously drives signal line PTR for all pixels 201 low to stop the reset operation, and simultaneously drives signal line TRN for all pixels 201 high to turn on transfer gate transistors 108 in all pixels 201. Immediately after this operation, the multiplied charge generated in avalanche photodiodes 102 is transferred to charge storages 105. Thereafter, at timing corresponding to the end of the distance zone to be measured, the photodetector according to Embodiment 2 simultaneously drives signal line TRN for all pixels 201 low to complete the transfer of the multiplied charge generated in avalanche photodiodes 102 to charge storages 105.

By a series of operations described above, only the multiplied charge caused by the light reflected off the subject present in the distance zone to be measured is stored in charge storages 105.

Thereafter, the photodetector according to Embodiment 2 simultaneously drives high signal line CNT for all pixels 201 which is connected to the gates of count transistors 206 so as to turn on count transistors 206 in all pixels 201. Here, when the multiplied charge is stored in charge storages 105, the multiplied charge is transferred to count capacitors 207, and thus the potentials of count capacitors 207 are lowered. Here, the first pulse period is completed.

Thereafter, the photodetector according to Embodiment 2 repeats the same operation as in the first pulse period to be able to enhance the probability of detecting the subject.

When in each pulse period, avalanche multiplication occurs in avalanche photodiode 102 while signal line TRN is high, the multiplied charge is transferred to count capacitor 207, and thus the potential of count capacitor 207 is changed. On the other hand, when avalanche multiplication does not occur, the potential of count capacitor 207 is not changed. In other words, the potential of count capacitor 207 corresponds to the number of times the avalanche multiplication occurs.

After repeating the same operation as in the first pulse period, the photodetector according to Embodiment 2 performs the sequential row feed operation (rolling drive operation) to read a signal corresponding to the charge stored in count capacitor 207 of each pixel 201. FIG. 4 illustrates an operation of reading the kth row.

In an operation of reading each row, the photodetector according to Embodiment 2 simultaneously drives high signal line SEL only for pixels 201 in the target row which is connected to the gates of selection transistors 111 so as to turn on selection transistors 111 in pixels 201 in the row, Thereafter, the photodetector according to Embodiment 2 simultaneously drives high signal line RST only for pixels 201 in the row so as to turn on reset transistors 109 in pixels 201 in the row. Then, the charge stored in charge storages 105 is discharged.

Thereafter, the photodetector according to Embodiment 2 simultaneously drives low signal line RST only for pixels 201 in the row so as to turn off reset transistors 109 in pixels 201 in the row. Then, second signals corresponding to the potentials of charge storages 105 in a state where the charge is discharged are output from amplifying transistors 110 to read line 113.

Thereafter, the photodetector according to Embodiment 2 simultaneously drives high signal line CNT only for pixels 201 in the row so as to turn on count transistors 206 in pixels 201 in the row. Then, the charge stored in count capacitors 207 is transferred to charge storages 105, and signals (which are also referred to as "third signals" for convenience) corresponding to the charge transferred to charge storages 105 are output from amplifying transistors 110 to read line 113.

Thereafter, the photodetector according to Embodiment 2 simultaneously drives high signal lines RST and CNT only for pixels 201 in the row so as to turn on reset transistors 109 and count transistors 206 in pixels 201 in the row. Then, the charge stored in charge storages 105 and count capacitors 207 is discharged.

Thereafter, the photodetector according to Embodiment 2 sequentially drives low signal lines RST, CNT, and SEL only for pixels 201 in the row. Here, the operation of reading each row is completed.

Thereafter, the photodetector according to Embodiment 2 or an external device performs the CDS processing on the third and second signals which are output, and thus information is obtained which indicates the number of times avalanche photodiodes 102 perform avalanche multiplication while signal line TRN is high during the pulse periods in which the pulse period is repeated a plurality of times.

Embodiment 3

Figure 5:
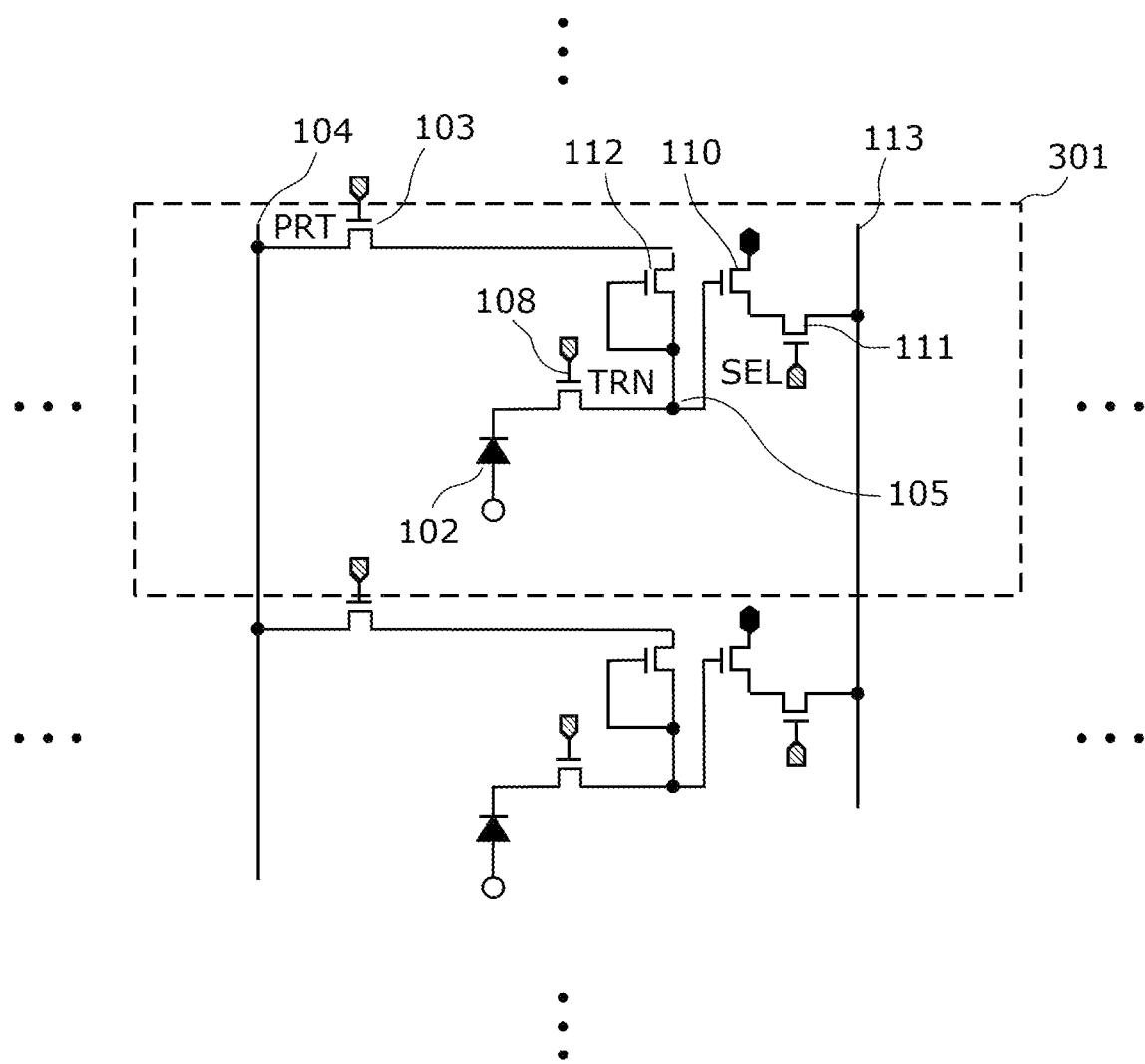
FIG. 5 is a circuit diagram showing the configuration of pixels included in a photodetector according to Embodiment 3.

FIG. 5 is a circuit diagram showing the configuration of a photodetector according to Embodiment 3. In the following description, constituent elements of the photodetector according to Embodiment 3 similar to the constituent elements of the photodetector according to Embodiment 1 are considered to have already been described and are therefore identified with the same reference signs, thus a detailed description thereof is omitted, and a description will be given mainly on differences from the photodetector according to Embodiment 1.

As shown in FIG. 5, the photodetector according to Embodiment 3 differs from the photodetector according to Embodiment 1 in that pixels 101 are changed to pixels 301.

In pixel 301, reset transistor 109 is deleted from pixel 101, and the arrangement of photodiode reset transistor 103 and quenching transistor 112 is changed such that avalanche photodiode 102 and the gate and the source of quenching transistor 112 are connected together via charge storage 105 and transfer gate transistor 108. Hence, charge storage 105 is connected to the gate and the source of quenching transistor 112, and the other of the source and the drain of transfer gate transistor 108 is connected to charge storage 105.

In the configuration of pixel 301 described above, photodiode reset transistor 103 can also have the function of reset transistor 109 in Embodiment 1.

In pixel 301 configured as described above, the potential of the cathode of avalanche photodiode 502 is reset by simultaneously turning on photodiode reset transistor 103 and transfer gate transistor 108.

In the photodetector of the configuration described above according to Embodiment 3, for the same reason as in the photodetector according to Embodiment 1, the problem of charge flowing into adjacent pixels can be solved.

Embodiment 4

Figure 6:
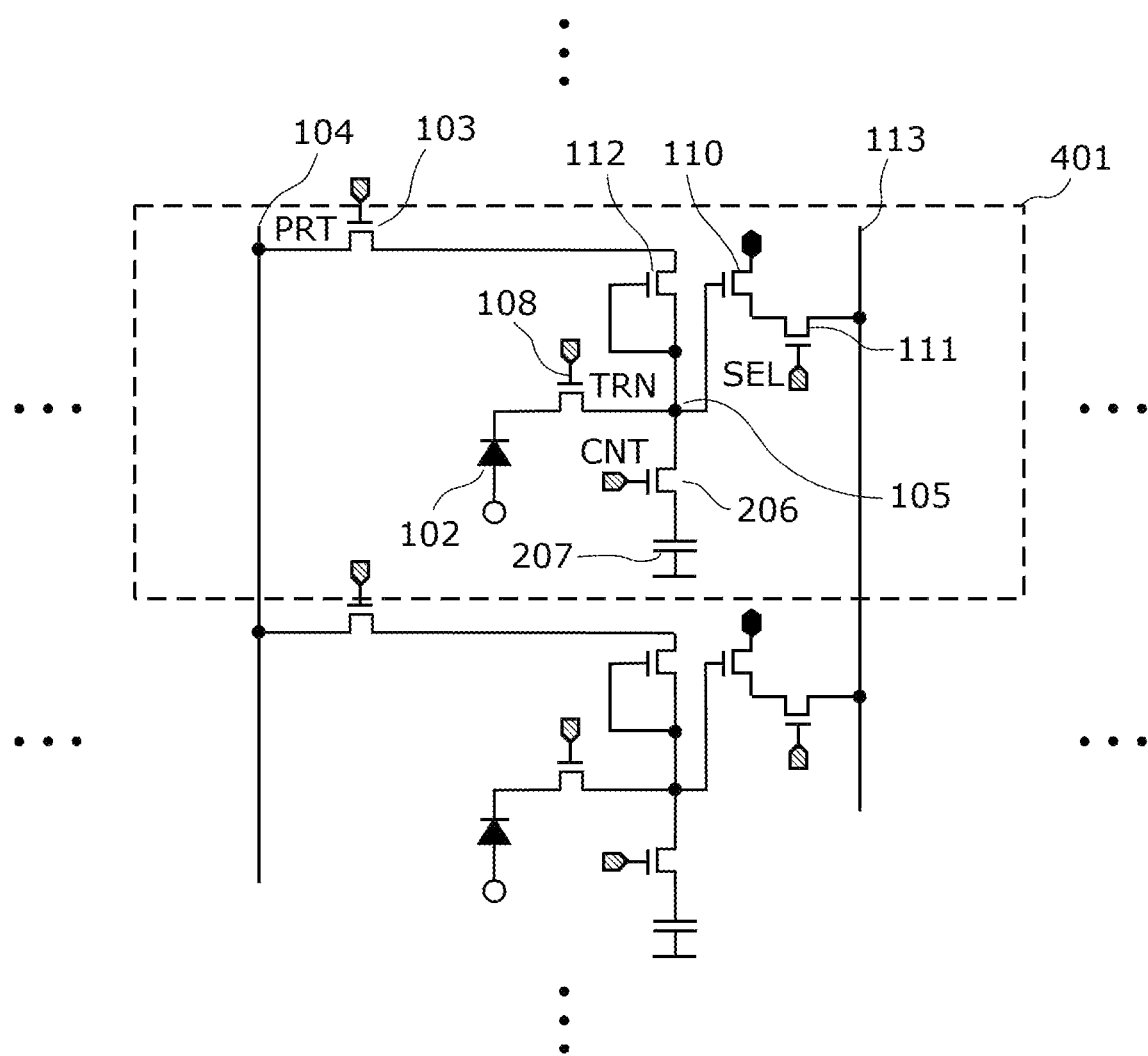
FIG. 6 is a circuit diagram showing the configuration of pixels included in a photodetector according to Embodiment 4.

FIG. 6 is a circuit diagram showing the configuration of a photodetector according to Embodiment 4. In the following description, constituent elements of the photodetector according to Embodiment 4 similar to the constituent elements of the photodetector according to Embodiment 3 are considered to have already been described and are therefore identified with the same reference signs, thus a detailed description thereof is omitted, and a description will be given mainly on differences from the photodetector according to Embodiment 2.

As shown in FIG. 6, the photodetector according to Embodiment 4 differs from the photodetector according to Embodiment 3 in that pixels 301 are changed to pixels 401.

In pixels 401, count transistors 206 and count capacitors 207 are added to pixels 301.

One of the source and the drain of count transistor 206 is connected to charge storage 105.

Count capacitor 207 is connected to the other of the source and the drain of count transistor 206.

In the photodetector of the configuration described above according to Embodiment 4, by the same operation as the operation performed by the photodetector according to Embodiment 2, the potential of count capacitor 207 can be a potential which corresponds to the number of times avalanche multiplication occurs.

In the photodetector of the configuration described above according to Embodiment 4, for the same reason as in the photodetector according to Embodiment 1, the problems of charge flowing into adjacent pixels can be solved.

Embodiment 5

Figure 7:
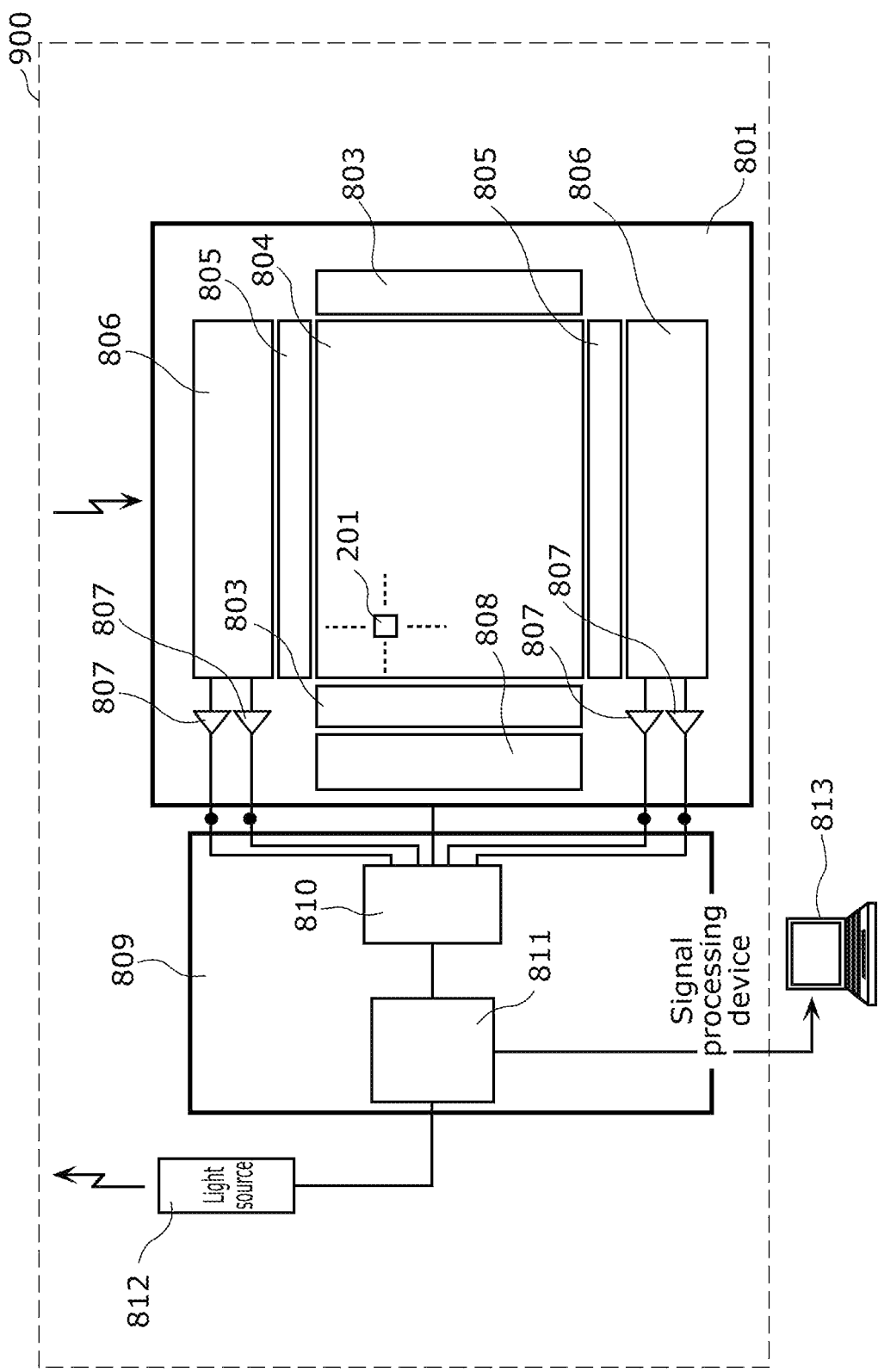
FIG. 7 is a block diagram showing the configuration of a distance measuring device according to Embodiment 5.

FIG. 7 is a block diagram showing the configuration of distance measuring device 900 according to Embodiment 5.

As shown in FIG. 7, distance measuring device 900 includes solid-state imaging device 801, signal processing device 809, and light source 812.

Light source 812 emits light which is applied to a subject.

Solid-state imaging device 801 includes the photodetector according to Embodiment 2, and receives reflected light resulting from the light emitted from light source 812 being reflected off the subject.

Solid-state imaging device 801 includes pixel array 804, column circuit 805, vertical transfer circuit 803, all-pixel drive driver 808, horizontal transfer circuit 806, and output amplifier 807.

In pixel array 804, a plurality of pixels 201 in Embodiment 1 are arranged in a matrix.

Column circuit 805 reads signals from pixels 201 row by row. Column circuit 805 may further include a column amplifier circuit for amplifying the signals which are read and a CDS circuit for performing the CDS processing.

Vertical transfer circuit 803 selects a row from which column circuit 805 reads the signals.

All-pixel drive driver 808 drives a signal line (such as signal line RST or signal line PTR) common to all pixels 201.

Horizontal transfer circuit 806 transfers the signals read by column circuit 805.

Output amplifier 807 outputs, to the outside, the signals transferred by horizontal transfer circuit 806.

Signal processing device 809 calculates a distance to the subject based on the signals output from solid-state imaging device 801. Signal processing device 809 further controls the operations of light source 812 and solid-state imaging device 801. Signal processing device 809 may further process the signals output from solid-state imaging device 801 to convert them into an image or the like.

Signal processing device 809 includes control circuit 810 and logic memory circuit 811.

Control circuit 810 controls the operation of solid-state imaging device 801, and processes the signals output from output amplifier 807. For example, when the signals output from output amplifier 807 are analog signals, control circuit 810 converts them into digital signals.

Logic memory circuit 811 controls timing at which light source 812 emits light, and performs signal processing on signals output from control circuit 810 to calculate the distance to the subject. For example, logic memory circuit 811 may output the result of the signal processing to external calculator 813.

Distance measuring device 900 configured described above operates light source 812 and solid-state imaging device 801 so as to synchronize the timing at which light source 812 emits light and the timing of exposure of solid-state imaging device 801, and thereby calculates the distance to the subject.

The calculation of the distance to the subject performed by distance measuring device 900 will be described below.

Distance measuring device 900 divides, into a plurality of parts, a distance range, from distance measuring device 900, where the subject serving as a target for distance measurement is present. In the following description, the divided distance ranges are referred to as "subranges". A subrange image obtained by imaging only the subject which is present in each subrange is imaged by solid-state imaging device 801. Thereafter, distance measuring device 900 uses logic memory circuit 811 to combine a plurality of subrange images imaged by solid-state imaging device 801, and calculates a distance image which has both distance information and image information. Then, based on the calculated distance image, the distance to the subject serving as the target for distance measurement is calculated.

Although in the present disclosure, the number of subranges is not limited, a description will be given here on the assumption that two subranges, that is, subrange 1 and subrange 2 are provided as an example.

Subrange 1 is a distance range in which the distance from distance measuring device 900 ranges from d1 to d1+dw. Subrange 2 is a distance range in which the distance from distance measuring device 900 ranges from d2 to d2+dw.

Distance measuring device 900 combines subrange image 1 corresponding to subrange 1 and subrange image 2 corresponding to subrange 2 to realize resolution dw of the distance and a distance range from d1 to d2+dw.

Figure 8:
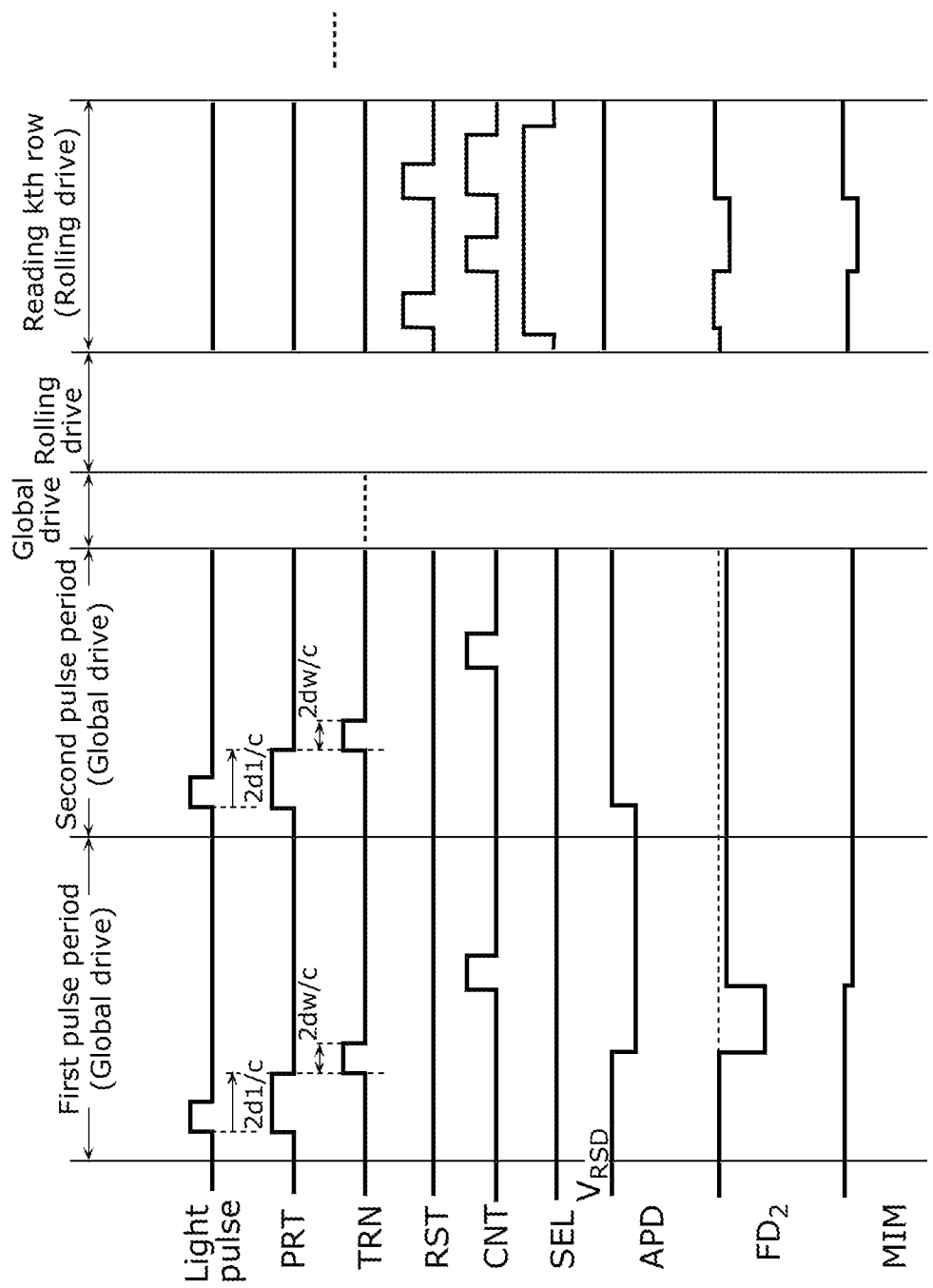
FIG. 8 is part 1 of a sequence diagram showing an example of an operation of imaging a subrange image performed by the distance measuring device according to Embodiment 5.

FIG. 8 is a sequence diagram showing an example of an operation of imaging subrange image 1 performed by distance measuring device 900.

As shown in FIG. 8, distance measuring device 900 performs the same operation as the operation which is shown in FIG. 4 and is performed by the photodetector according to Embodiment 2, and thereby images subrange image 1. Hence, although here, a detailed description thereof is omitted, the feature here is that with timing at which only 2d1/c has elapsed after light source 812 emits a light pulse, distance measuring device 900 simultaneously drives signal line TRN for all pixels 201 high to turn on transfer gate transistors 108 in all pixels 201, and starts exposure in solid-state imaging device 801. Then, distance measuring device 900 holds this state only for dw, and thereafter drives signal line TRN low to turn off transfer gate transistors 108 in all pixels 201, In this way, distance measuring device 900 images subrange image 1.

Figure 9:
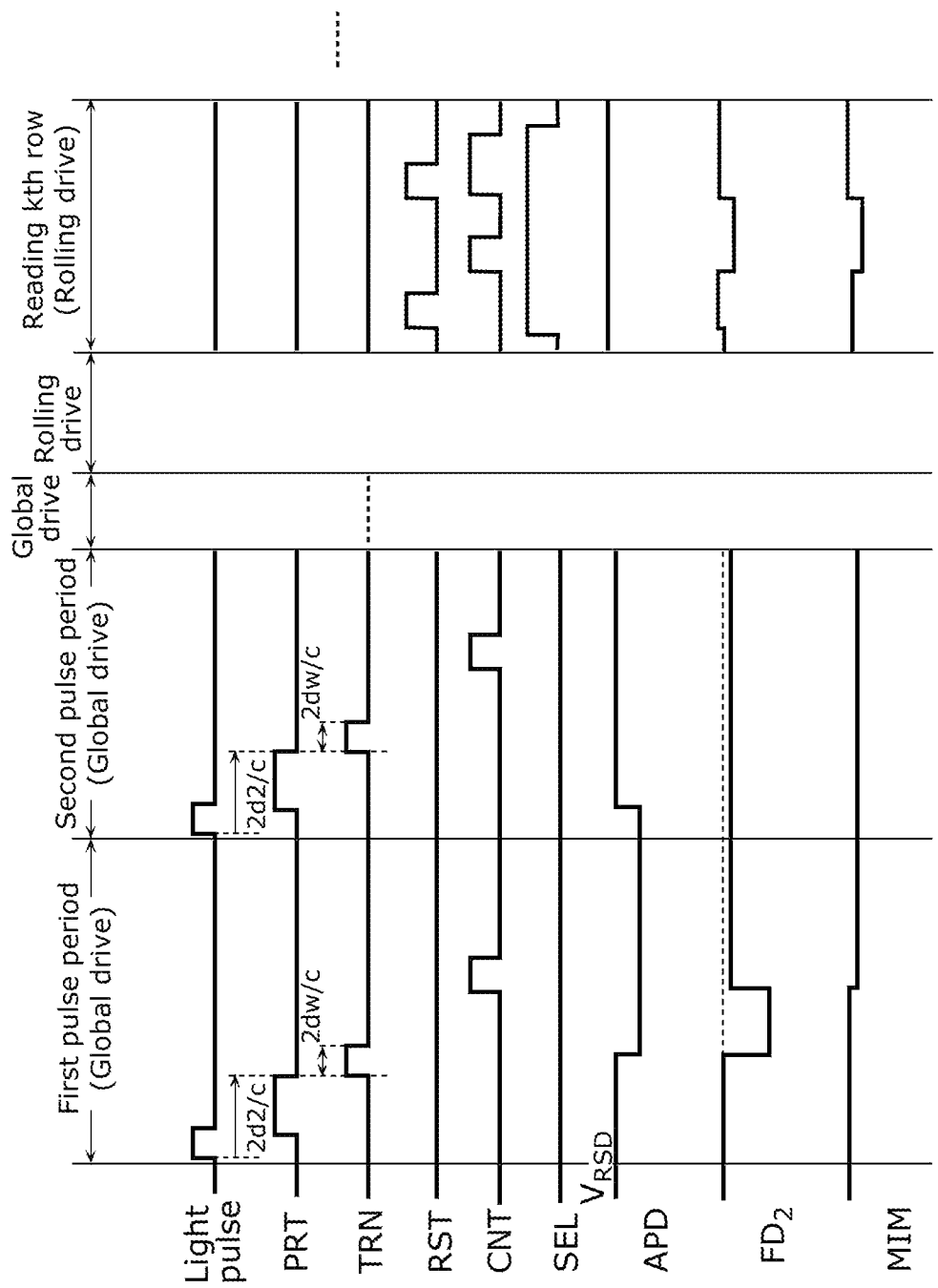
FIG. 9 is part 2 of the sequence diagram showing the example of the operation of imaging the subrange image performed by the distance measuring device according to Embodiment 5.

FIG. 9 is a sequence diagram showing an example of an operation of imaging subrange image 2 performed by distance measuring device 900.

As shown in FIG. 9, distance measuring device 900 performs the same operation as the operation which is shown in FIG. 4 and is performed by the photodetector according to Embodiment 2, and thereby images subrange image 2. Hence, although here, a detailed description thereof is omitted, the feature here is that with timing at which only 2d2/c has elapsed after light source 812 emits a light pulse, distance measuring device 900 simultaneously drives signal line TRN for all pixels 201 high to turn on transfer gate transistors 108 in all pixels 201, and starts exposure in solid-state imaging device 801. Then, distance measuring device 900 holds this state only for dw, and thereafter drives signal line TRN low to turn off transfer gate transistors 108 in all pixels 201. In this way, distance measuring device 900 images subrange image 2.

When subrange image 1 and subrange image 2 are imaged, logic memory circuit 811 combines subrange images 1 and 2 to calculate a distance image, and calculates, based on the calculated distance image, the distance to the subject serving as the target for distance measurement.

SUPPLEMENTARY INFORMATION

Embodiments 1 to 5 have been described above as examples of techniques disclosed in the present application. However, the techniques in the present disclosure are not limited to these embodiments, and can also be applied to embodiments or variations obtained by performing modification, replacement, addition, omission, and the like as necessary without departing from the spirit of the present disclosure.

INDUSTRIAL APPLICABILITY

The photodetector and the like according to the present disclosure can be widely utilized in devices for detecting light and the like.

The invention claimed is:

1. A photodetector comprising:
a plurality of pixels; and
a common reset line that is connected to the plurality of pixels,
wherein each of the plurality of pixels includes:
an avalanche photodiode;
a quenching transistor that includes a gate and a source which are connected to a cathode of the avalanche photodiode; and
a photodiode reset transistor that includes a source and a drain one of which is connected to a drain of the quenching transistor and an other of which is connected to the common reset line.

2. The photodetector according to claim 1,
wherein each of the plurality of pixels further includes:
a charge storage that stores charge generated by the avalanche photodiode; and
a transfer gate transistor that includes a source and a drain one of which is connected to the cathode of the avalanche photodiode and an other of which is connected to the charge storage.

3. The photodetector according to claim 2, further comprising:
a read line that is connected to the plurality of pixels,
wherein each of the plurality of pixels further includes:
a reset transistor that includes a source and a drain one of which is connected to the charge storage;
an amplifying transistor that includes a gate which is connected to the charge storage; and
a selection transistor that includes a source and a drain one of which is connected to one of a source and a drain of the amplifying transistor and an other of which is connected to the read line.

4. The photodetector according to claim 2,
wherein each of the plurality of pixels further includes:
a count transistor that includes a source and a drain one of which is connected to the charge storage; and
a count capacitor that is connected to an other of the source and the drain of the count transistor.

5. The photodetector according to claim 1,
wherein each of the plurality of pixels further includes, between the cathode of the avalanche photodiode and the gate and the source of the quenching transistor:
a charge storage that is connected to the gate and the source of the quenching transistor and stores charge generated by the avalanche photodiode; and
a transfer gate transistor that includes a source and a drain one of which is connected to the cathode of the avalanche photodiode and an other of which is connected to the charge storage, and
the cathode of the avalanche photodiode is connected to the gate and the source of the quenching transistor via the charge storage and the transfer gate transistor.

6. The photodetector according to claim 5, further comprising:
a read line that is connected to the plurality of pixels,
wherein each of the plurality of pixels further includes:
an amplifying transistor that includes a gate which is connected to the charge storage; and
a selection transistor that includes a source and a drain one of which is connected to one of a source and a drain of the amplifying transistor and an other of which is connected to the read line.

7. The photodetector according to claim 1,
wherein when a potential of the cathode of the avalanche photodiode is a potential at which avalanche multiplication stops, the quenching transistor is in a weak inversion state.

8. The photodetector according to claim 1,
wherein when the photodiode reset transistor is on, a time constant of an electrical path from the cathode of the avalanche photodiode to the common reset line is greater than or equal to 100 ps.

9. A solid-state imaging device comprising the photodetector according to claim 1, the solid-state imaging device further comprising:
a pixel array that includes the plurality of pixels which are arranged in a matrix;

a column circuit that reads signals from the plurality of pixels row by row;

a vertical transfer circuit that selects a row from which the column circuit reads signals;

an all-pixel drive driver that drives a signal line common to all the plurality of pixels;

a horizontal transfer circuit that transfers the signals read by the column circuit; and an output amplifier that outputs, to an outside, the signals transferred by the horizontal transfer circuit.

10. A distance measuring device comprising:

a light source that emits light to a subject:

the solid-state imaging device according to claim 9 that receives reflected light resulting from the light emitted from the light source being reflected off the subject; and a signal processing device that calculates a distance to the subject based on signals output from the solid-state imaging device.

\* \* \* \* \*